United States Patent
Uramoto (10) Patent No.: US 9,224,756 B2
(45) Date of Patent: Dec. 29, 2015

(54) DISPLAY DEVICE

(71) Applicant: Japan Display Inc., Minato-ku (JP)

(72) Inventor: Seiichi Uramoto, Tokyo (JP)

(73) Assignee: Japan Display Inc., Minato-ku (JP)

( * ) Notice: Subject to any disclaimer, the term of this patent is extended or adjusted under 35 U.S.C. 154(b) by 5 days.

(21) Appl. No.: 14/182,408

(22) Filed: Feb. 18, 2014

(65) Prior Publication Data

US 2014/0239304 A1    Aug. 28, 2014

(30) Foreign Application Priority Data

Feb. 25, 2013 (JP) ................................ 2013-034533

(51) Int. Cl.
*H01L 27/12* (2006.01)
*H01L 29/786* (2006.01)

(52) U.S. Cl.
CPC ...... *H01L 27/1222* (2013.01); *H01L 29/78621* (2013.01); *H01L 29/78645* (2013.01); *H01L 29/78696* (2013.01)

(58) Field of Classification Search
CPC .................. H01L 29/78621; H01L 29/78645; H01L 27/1222; H01L 29/78696
See application file for complete search history.

(56) References Cited

U.S. PATENT DOCUMENTS

| 6,713,748 | B1 | 3/2004 | Tsutsumi et al. | |
| 7,579,220 | B2 * | 8/2009 | Ohnuma et al. | 438/149 |
| 2006/0270124 | A1 * | 11/2006 | You | 438/151 |

FOREIGN PATENT DOCUMENTS

| JP | 5-289103 | 11/1993 |
| JP | 7-263705 | 10/1995 |
| JP | 2000-12866 | 1/2000 |

* cited by examiner

*Primary Examiner* — Whitney T Moore
(74) *Attorney, Agent, or Firm* — Oblon, McClelland, Maier & Neustadt, L.L.P.

(57) ABSTRACT

According to one embodiment, a display device includes a semiconductor including a first channel region, a second channel region, a source region, a drain region, a first region located between the source region and the first channel region, a second region formed between the first channel region and the second channel region, and a third region located between the drain region and the second channel region, wherein the second region has a length of 5 μm or more, which is greater than a length of each of the first region and the third region.

7 Claims, 6 Drawing Sheets

DISPLAY DEVICE

CROSS-REFERENCE TO RELATED APPLICATIONS

This application is based upon and claims the benefit of priority from Japanese Patent Application No. 2013-034533, filed Feb. 25, 2013, the entire contents of which are incorporated herein by reference.

FIELD

Embodiments described herein relate generally to a display device.

BACKGROUND

In recent years, display devices including thin-film transistors have been put to practical use. Examples of the display devices are a liquid crystal display device and an organic electroluminescence display device. With an increasing demand for higher definition of the display device, the area of a pixel aperture portion, which contributes to display, has become smaller. The size of the thin-film transistor, which is disposed in each pixel, tends to become smaller, in order to suppress a decrease in area of the pixel aperture portion. However, the reduction in size of the thin-film transistor is a factor of an increase in leak current.

When the leak current in the thin-film transistor is large, there is a concern that such a display defect that a pixel becomes a bright point will occur. As a structure of a thin-film transistor for suppressing a leak current, there is known such a structure that a low-concentration impurity region, or a so-called Lightly Doped Drain (LDD), is provided between a channel region and a high-concentration impurity region. For example, as regards a thin-film transistor having two gate electrodes, there is known a structure in which an LDD region is provided between a first channel region and a second channel region, or a structure in which LDD regions are provided on both sides of each of a first channel region and a second channel region.

DETAILED DESCRIPTION

In general, according to one embodiment, a display device includes: an insulative substrate; a semiconductor layer located above the insulative substrate and formed of polysilicon, the semiconductor layer including a first channel region, a second channel region, a source region, a drain region, a first region located between the source region and the first channel region and having an impurity concentration which is lower than an impurity concentration of the source region and is higher than an impurity concentration of the first channel region, a second region formed between the first channel region and the second channel region and having an impurity concentration which is equal to the impurity concentration of the first region, and a third region located between the drain region and the second channel region and having an impurity concentration which is lower than an impurity concentration of the drain region and is higher than an impurity concentration of the second channel region; an insulation film covering the semiconductor layer; a first gate electrode formed on the insulation film and located above the first channel region, a second gate electrode which is electrically connected to the first gate electrode, is formed on the insulation film, and is located above the second channel region; a source electrode put in contact with the source region; a drain electrode put in contact with the drain region; a source line electrically connected to the source electrode and supplied with a video signal; and a pixel electrode which is electrically connected to the drain electrode and in which a pixel potential corresponding to the video signal is written, wherein the second region has a length of 5 µm or more, which is greater than a length of each of the first region and the third region.

According to another embodiment, a display device includes: an insulative substrate; a semiconductor layer located above the insulative substrate and formed of polysilicon, the semiconductor layer including a first channel region, a second channel region, a source region, a drain region, a first region located between the source region and the first channel region and having an impurity concentration which is lower than an impurity concentration of the source region and is higher than an impurity concentration of the first channel region, a second region formed between the first channel region and the second channel region and having an impurity concentration which is equal to the impurity concentration of the first region, and a third region located between the drain region and the second channel region and having an impurity concentration which is lower than an impurity concentration of the drain region and is higher than an impurity concentration of the second channel region; an insulation film covering the semiconductor layer; a first gate electrode formed on the insulation film and located above the first channel region, a second gate electrode which is electrically connected to the first gate electrode, is formed on the insulation film, and is located above the second channel region; a source electrode put in contact with the source region; a drain electrode put in contact with the drain region; a source line electrically connected to the source electrode and supplied with a video signal; and a pixel electrode which is electrically connected to the drain electrode and in which a pixel potential corresponding to the video signal is written, wherein the second region has a higher resistance than each of the first region and the third region.

Embodiments will now be described in detail with reference to the accompanying drawings. In the drawings, structural elements having the same or similar functions are denoted by like reference numerals, and an overlapping description is omitted.

Figure 1:
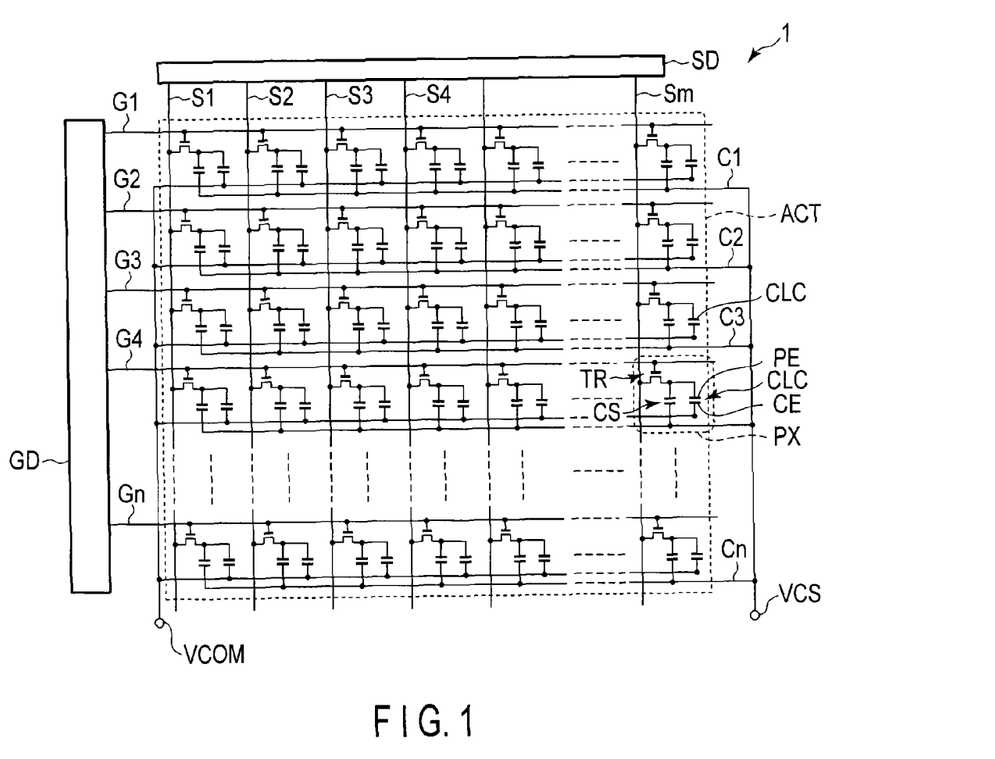
FIG. 1 is a view which schematically illustrates a structure example of a display device according to an embodiment.

FIG. 1 is a view which schematically illustrates a structure example of a display device according to an embodiment. In this example, a liquid crystal display device is described as the display device.

Specifically, a liquid crystal display device 1 includes a display section (active area) ACT which displays an image. The display section ACT is composed of a plurality of pixels PX which are arrayed in a matrix.

In the display section ACT, gate lines G (G1 to Gn), capacitance lines C (C1 to Cn) and source lines S (S1 to Sm) are formed. Each of the gate lines G is led out of the display section ACT and is connected to a gate driver GD. Each of the source lines S is led out of the display section ACT and is connected to a source driver SD. The capacitance line C is electrically connected to a voltage application module VCS to which a storage capacitance voltage is applied.

Each pixel PX is composed of a liquid crystal capacitor CLC, a thin-film transistor (TFT) TR, and a capacitor (also referred to as "auxiliary capacitance" or "storage capacitance") CS which is parallel to the liquid crystal capacitor CLC. The liquid crystal capacitor CLC is composed of a pixel electrode which is electrically connected to the thin-film transistor TR, a common electrode CE which is electrically connected to a power supply module VCOM of a common potential, and a liquid crystal layer which is interposed between the pixel electrode PE and the common electrode CE.

The thin-film transistor TR is electrically connected to the gate line G and source line S. A control signal for ON/OFF controlling the thin-film transistor TR is supplied to the gate line G. A video signal is supplied to the source line S. When the thin-film transistor TR is turned on by the control signal supplied to the gate line G, the thin-film transistor TR writes in the pixel electrode PE a pixel potential which corresponds to the video signal supplied to the source line S. A voltage, which is applied to the liquid crystal layer, is controlled by a potential difference between the common electrode CE of the common potential and the pixel electrode PE of the pixel potential.

The capacitor CS holds the voltage, which is applied to the liquid crystal layer, for a fixed period, and is composed of a pair of electrodes which are opposed via an insulation film. For example, the capacitor CS is composed of a first terminal electrode having the same potential as the pixel electrode PE, a second terminal electrode which is a part of the capacitance line C or is electrically connected to the capacitance line C, and an insulation film interposed between the first terminal electrode and the second terminal electrode.

Figure 2:
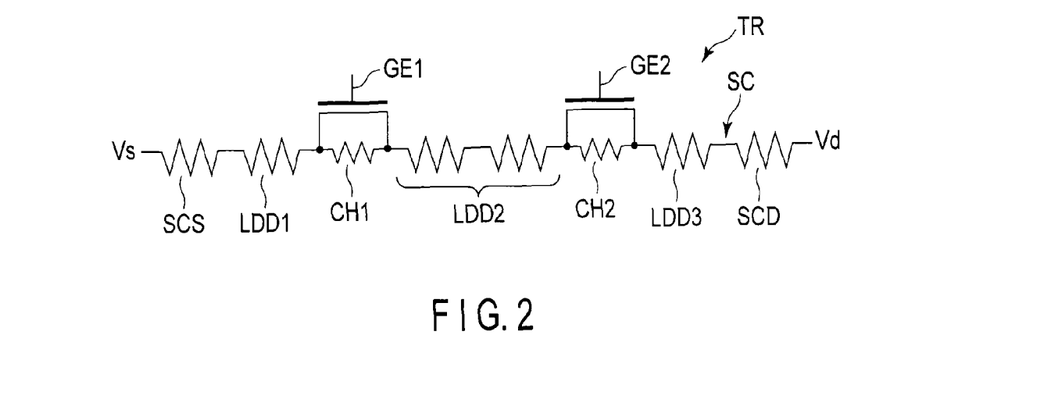
FIG. 2 is a view which illustrates an equivalent circuit of a thin-film transistor TR shown in FIG. 1.

FIG. 2 is a view which illustrates an equivalent circuit of the thin-film transistor TR shown in FIG. 1.

The thin-film transistor TR illustrated has a double-gate structure including two gate electrodes, namely a first gate electrode GE1 and a second gate electrode GE2. Incidentally, it is assumed that when the potential of one end-side terminal of the thin-film transistor TR is Vs and the potential of the other end-side terminal is Vd, a relationship of, for example, Vd>Vs, is established. There may be a case where the one end-side terminal (low potential-side terminal) of the potential Vs is connected to the source line S and the other end-side terminal (high potential-side terminal) of the potential Vd is connected to the pixel electrode PE, or there may be a case where the one end-side terminal is connected to the pixel electrode PE and the other end-side terminal is connected to the source line S.

The thin-film transistor TR includes a semiconductor layer SC between the one end-side terminal and the other end-side terminal. The semiconductor layer SC includes, for example, in an order from the one end-side terminal to the other end-side terminal, a source region SCS, a first region LDD1, a first channel region CH1, a second region LDD2, a second channel region CH2, a third region LDD3, and a drain region SCD.

Figure 3:
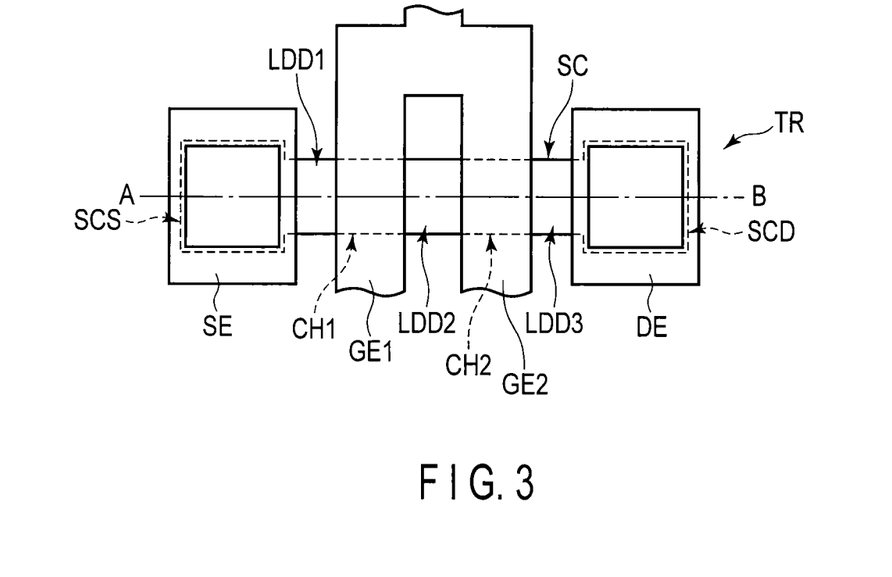
FIG. 3 is a plan view which schematically illustrates a structure example of the thin-film transistor TR shown in FIG. 1.
Figure 4:
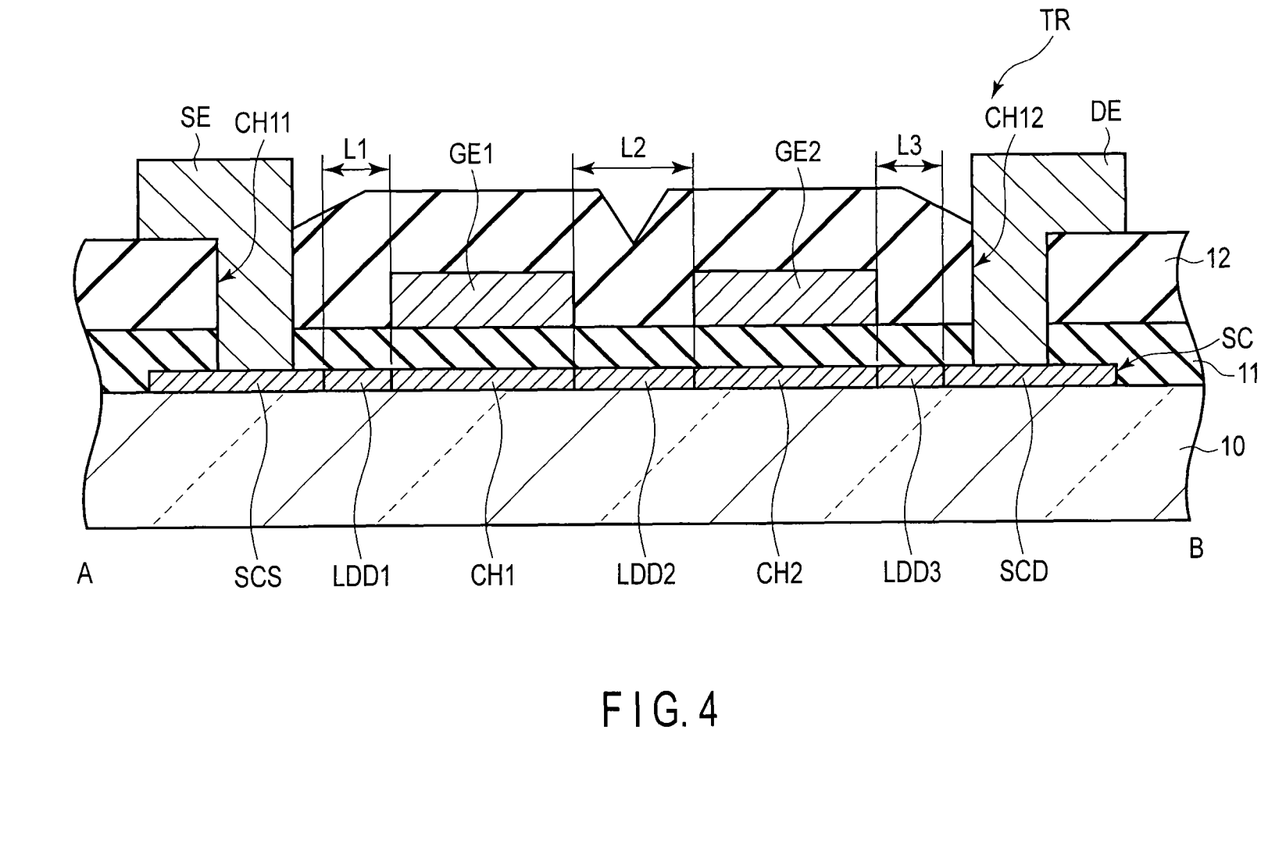
FIG. 4 is a cross-sectional view, taken along line A-B in FIG. 3, which schematically illustrates a cross-sectional structure of the thin-film transistor TR shown in FIG. 3.

FIG. 3 is a plan view which schematically illustrates a structure example of the thin-film transistor TR shown in FIG. 1. FIG. 4 is a cross-sectional view, taken along line A-B in FIG. 3, which schematically illustrates a cross-sectional structure of the thin-film transistor TR shown in FIG. 3.

An insulative substrate 10 is a glass substrate or a resin substrate. The thin-film substrate TR is, for example, of an n type, and is formed on the insulative substrate 10. The semiconductor layer SC is located on the insulative substrate 10. Incidentally, another insulative film may be interposed between the insulative substrate 10 and the semiconductor layer SC. The semiconductor layer SC is formed of, for example, polysilicon. The semiconductor layer SC includes the first channel region CH1 and second channel region CH2, the source region SCS and drain region SCD which are high-concentration impurity regions, and the first region LDD1, second region LDD2 and third region LDD3 which are low-concentration impurity regions. Impurities, such as phosphorus (P), are doped in the high-concentration impurity regions and low-concentration impurity regions. The impurity concentration (dosage) of the low-concentration impurity region is, for example, about $(1.0{\sim}2.0){\times}10^{13}/cm^2$.

The first region LDD1 is located between the source region SCS and the first channel region CH1, and is continuous with the source region SCS and the first channel region CH1. The impurity concentration of the first region LDD1 is lower than that of the source region SCS and is higher than that of the first channel region CH1.

The second region LDD2 is located between the first channel region CH1 and second channel region CH2, and is continuous with the first channel region CH1 and second channel region CH2. The impurity concentration of the second region LDD2 is equal to that of the first region LDD1.

The third region LDD3 is located between the drain region SCD and the second channel region CH2, and is continuous with the drain region SCD and the second channel region CH2. The impurity concentration of the third region LDD3 is equal to that of the first region LDD1, and is lower than the impurity concentration of the drain region SCD and is higher than that of the second channel region CH2. This semiconductor layer SC is covered with a first insulation film 11. The first insulation film 11 is also disposed on the insulative substrate 10.

In the example illustrated, since the semiconductor layer SC has a substantially linear pattern, a length L1 of the first region LDD1, a length L2 of the second region LDD2 and a length L3 of the third region LDD3 correspond to lengths in a direction of extension of the semiconductor layer SC. Specifically, the length L1 is a length between the source region SCS and the first channel region CH1, the length L2 is a length between the first channel region CH1 and the second channel region CH2, and the length L3 is a length between the second channel region CH2 and the drain region SCD.

In the meantime, although the semiconductor layer SC is formed to have a substantially linear pattern in the example illustrated, the semiconductor layer SC may be formed to have a bent or meandering pattern, such as an L-shaped pattern, a crank-shaped pattern or a U-shaped pattern. When the semiconductor layer SC has a bent or meandering pattern, the lengths L1 to L3 become lengths calculated based on the associated pattern.

The first gate electrode GE1 and second gate electrode GE2 are formed on the first insulation film 11, with a distance between the first gate electrode GE1 and second gate electrode GE2. The first channel region CH1 is located at a position overlapping the first gate electrode GE1, and the second channel region CH2 is located at a position overlapping the second gate electrode GE2. Specifically, the first channel region CH1 and first gate electrode GE1 are opposed via the first insulation film 11, and the second channel region CH2 and second gate electrode GE2 are opposed via the first insulation film 11. The second region LDD2 is located between the first gate electrode GE1 and second gate electrode GE2. The first gate electrode GE1 and second gate electrode GE2 are covered with a second insulation film 12. The second insulation film 12 is also disposed on the first insulation film 11.

The thin-film transistor TR includes a source electrode SE and a drain electrode DE as a one end-side terminal and the other end-side terminal. The source electrode SE and drain electrode DE are formed on the second insulation film 12. The source electrode SE is put in contact with the source region SCS via a contract hole CH11 which penetrates the first insulation film 11 and second insulation film 12. The drain electrode DE is put in contact with the drain region SCD via a contract hole CH12 which penetrates the first insulation film 11 and second insulation film 12. In the meantime, the source electrode SE is electrically connected to the source line, and the drain electrode DE is electrically connected to the pixel electrode.

Next, a brief description is given of an example of a manufacturing method of the thin-film transistor TR having the above-described structure.

Specifically, after an island-shaped semiconductor layer SC of polysilicon is formed, a first insulation film 11 is formed. Then, a first gate electrode GE1 and a second gate electrode GE2 are formed. Subsequently, in a first impurity doping step, impurities, such as a small amount of phosphorus, are doped by using the first gate electrode GE1 and second gate electrode GE2 as a mask. Then, which become the first region LDD1, second region LDD2, third region LDD3, first gate electrode GE1 and second gate electrode GE2, are covered with a resist, and aperture portions of the resist are formed in regions which become the source region SCS and drain region SCD. Subsequently, in a second impurity doping step, regions, impurities, such as phosphorus, are doped in the semiconductor layer SC. The regions, which were doped with impurities by only the first impurity doping step, become low-concentration impurity regions (first region LDD1, second region LDD2 and third region LDD3), and the regions, which were doped with impurities by the first impurity doping step and the second impurity doping step, become high-concentration impurity regions (source region SCS and drain region SCD).

Next, a description is given of the relationship between the length of each of the first region LDD1, second region LDD2 and third region LDD3 and a leak current in the thin-film transistor TR.

As the length of each of the first region LDD1, second region LDD2 and third region LDD3 is made greater, the leak current of the thin-film transistor can be made smaller. In particular, as the length of the low-potential-side LDD of the thin-film transistor is made greater, the effect of leak current reduction is greater. Ideally, in the transistor of FIG. 2 to FIG. 4, it is assumed that if the length of the first region LDD1 or the length of the third region LDD3 is increased, the effect of leak current reduction becomes greater. However, in fact, when the resist having aperture portions at only the source region SCS and drain region SCD is formed, there may be a case in which a mask misalignment occurs. In this case, impurities are doped in the first region LDD1 or the third region LDD3 by the second impurity doping step, and a high-concentration impurity region is formed in a part of the first region LDD1 or a part of the third region LDD3. Thus, a variance in the length L1 or length L3 increases, and there is a concern that the leak current reduction effect at a time when the length of the first region LDD1 or third region LDD3 is increased, varies greatly among samples. In addition, in the case where the length of the first region LDD1 or the length of the third region LDD3 is increased by taking such a variance into account, the ON resistance of the above-described thin-film transistor is also affected.

As described above, the inventor has made various studies, and found optimization of the lengths of the first region LDD1, second region LDD2 and third region LDD3 in the thin-film transistor TR with the above-described structure, in order to suppress a leak current without depending on the variance in manufacturing steps or without greatly affecting the ON resistance.

Figure 5:
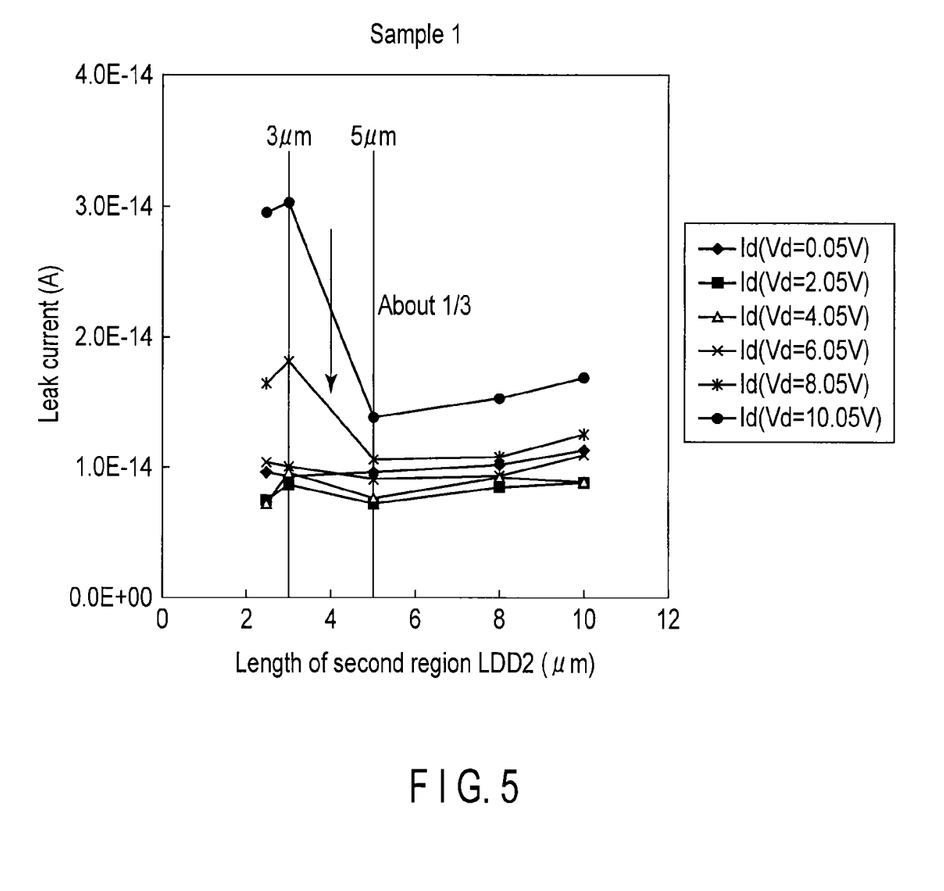
FIG. 5 is a graph illustrating a simulation result of a leak current in relation to the length of a second region LDD2, with respect to Sample 1 of the thin-film transistor TR of the embodiment.
Figure 6:
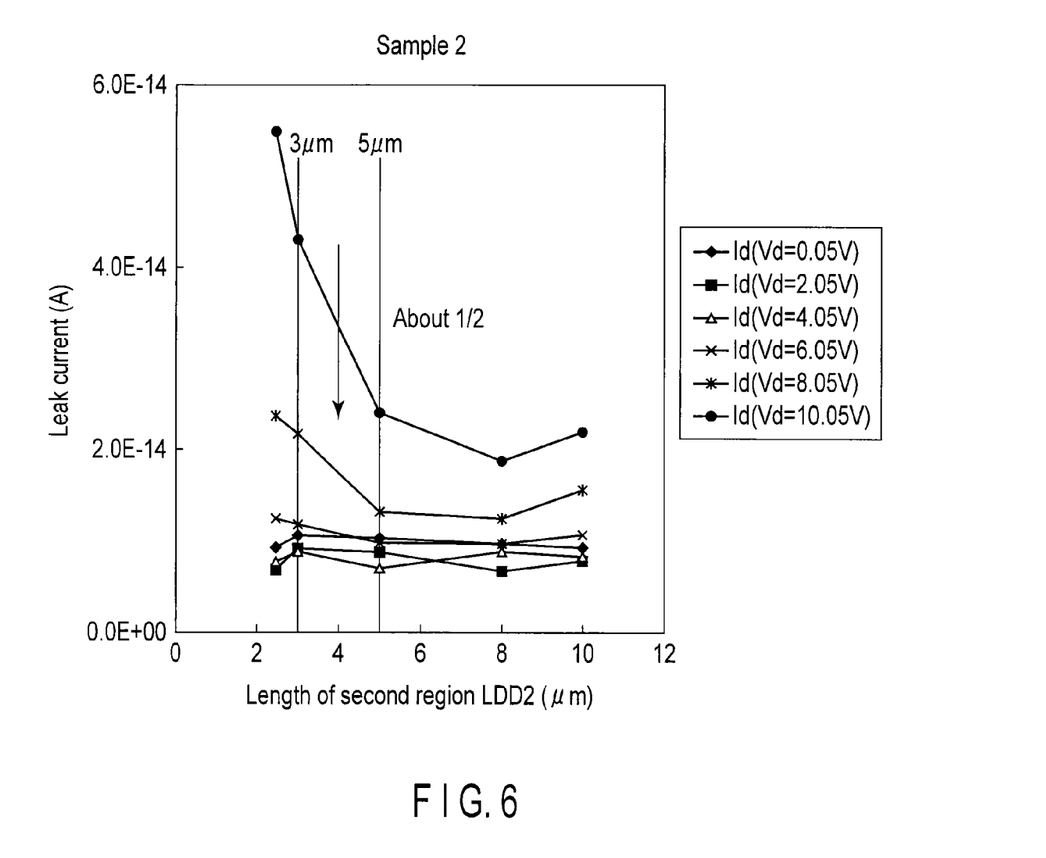
FIG. 6 is a graph illustrating a simulation result of a leak current in relation to the length of the second region LDD2, with respect to Sample 2 of the thin-film transistor TR of the embodiment.
Figure 7:
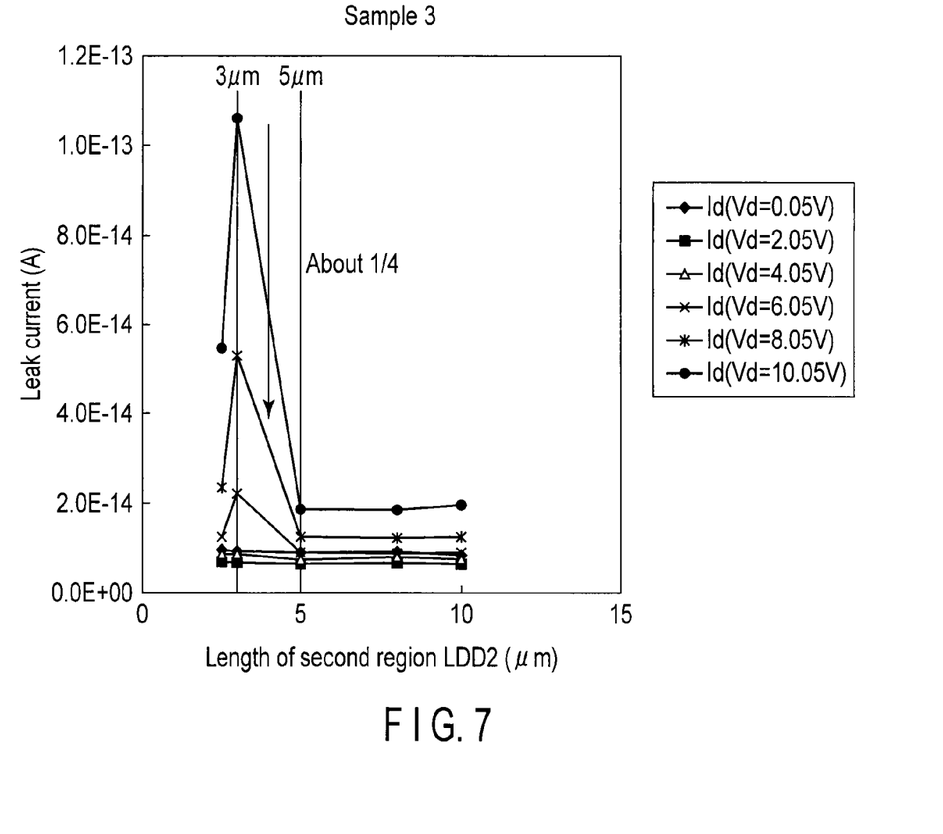
FIG. 7 is a graph illustrating a simulation result of a leak current in relation to the length of the second region LDD2, with respect to Sample 3 of the thin-film transistor TR of the embodiment.

FIG. 5, FIG. 6 and FIG. 7 are graphs showing evaluation results of the leak current in relation to the length of the second region LDD2, with respect to samples of the thin-film transistor TR with the above-described structure. In the samples, the design value of the length of each of the first channel region CH1 and second channel region CH2 is 3 µm, and the design value of each of the length L1 of the first region LDD1 and the length L3 of the third region LDD3 is 3 µm.

According to the evaluation result of Sample 1 shown in FIG. 5, it was confirmed that the leak current can be suppressed by making the length L2 greater than each of the lengths L1 and L3, compared to the case in which the length L2 of the second region LDD2 is 3 µm according to design and is equal to each of the length L1 of the first region LDD1 and the length L3 of the third region LDD3. In particular, as illustrated in the Figure, it was confirmed that the leak current was successfully reduced to about ⅓, compared to the case where the length L2 is 3 µm, by setting the length L2 at 5 µm or more.

In this manner, by increasing the length L2 of the second region LDD2 which is located between the first channel region CH1 and second channel region CH2 and by setting, in particular, the length L2 at 5 µm or more, the resistance of the second region LDD2 can be increased without greatly depending on the variance in manufacturing step, and the leak current in the thin-film transistor TR can be reduced.

In addition, since the second region LDD2 is located between the first gate electrode GE1 and second gate electrode GE2, the second region LDD2 is the region which is, together with the first gate electrode GE1 and second gate electrode GE2, exactly covered with the resist in the second impurity doping step. Specifically, since the length L2 of the second region LDD2 is determined by the interval between the first gate electrode GE1 and second gate electrode GE2, the length L2 becomes substantially equal to the design value. Thus, compared to the length L1 of the first region LDD1 and the length L3 of the third region LDD3, the length L2 of the second region LDD2 is less affected by the manufacturing process, for example, the patterning precision of the resist. Accordingly, a variance in the length L2 in the manufacture process can be reduced, and a variance in capability of the thin-film transistor TR can be suppressed. Thereby, the leak current and ON resistance of the thin-film transistor TR can be designed at optimal values.

By applying the thin-film transistor TR with the above-described structure, the leak current can be suppressed and designed at the optimal value, without greatly depending on a variance in the manufacture process. Thus, the occurrence of a display defect in each pixel can be suppressed. In addition, since a variance in capability of the thin-film transistor TR of each pixel can be suppressed, a variance in brightness can be suppressed over the entire display section. Therefore, degradation in display capability can be suppressed.

According to the evaluation result of Sample 2 shown in FIG. 6, it was confirmed that the leak current can be suppressed by making the length L2 greater than each of the lengths L1 and L3, compared to the case in which the length L2 of the second region LDD2 is 3 μm according to design. In particular, as illustrated in the Figure, it was confirmed that the leak current was successfully reduced to about ½, compared to the case where the length L2 is 3 μm, by setting the length L2 at 5 μm or more. Therefore, in Sample 2, the same advantageous effects as in Sample 1 can be obtained.

According to the evaluation result of Sample 3 shown in FIG. 7, it was confirmed that the leak current can be suppressed by making the length L2 greater than each of the lengths L1 and L3, compared to the case in which the length L2 of the second region LDD2 is 3 μm according to design. In particular, as illustrated in the Figure, it was confirmed that the leak current was successfully reduced to about ¼, compared to the case where the length L2 is 3 μm, by setting the length L2 at 5 μm or more. Therefore, in Sample 3, the same advantageous effects as in Sample 1 can be obtained.

Aside from the above-described evaluations, a similar evaluation was conducted with respect to the case in which each of the length L1 and length L3 was set at less than 3 μm, and it was confirmed that the leak current can be suppressed without depending on a variance in manufacture process, by setting the length L2 at 5 μm or more.

In addition, aside from the case in which the semiconductor layer SC has a substantially linear shape, as shown in FIG. 3, even in the case in which the semiconductor layer SC has a bent or meandering shape, it was confirmed that the same advantageous effects as in the above-described evaluations can be obtained if the length L2 is substantially 5 μm or more Next, another structure example of the embodiment will be described.

Figure 8:
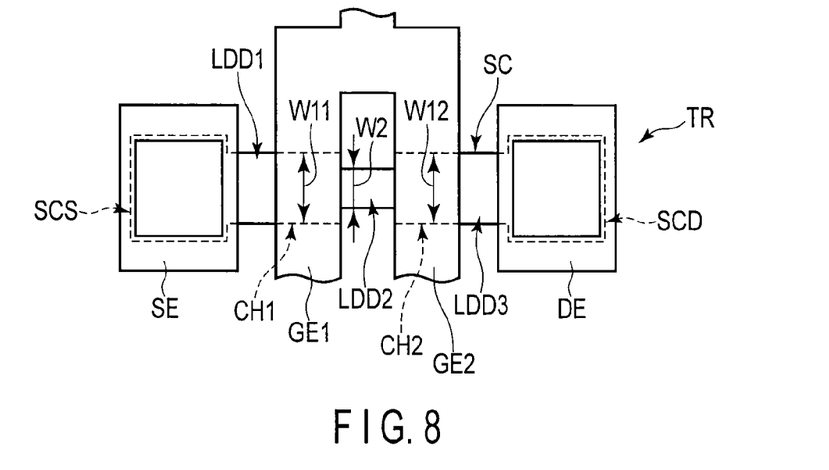
FIG. 8 is a plan view which schematically illustrates another structure example of the thin-film transistor TR shown in FIG. 1.

FIG. 8 is a plan view which schematically illustrates another structure example of the thin-film transistor TR shown in FIG. 1.

The structure example illustrated is different from the structure example shown in FIG. 3, in that the second region LDD2 is formed to have a less width than each of the first channel region CH1 and second channel region CH2. For example, when each of a width W11 of the first channel region CH1 and a width W12 of the second channel region CH2 is 3 μm, a width W2 of the second region LDD2 is set at 2.5 μm. Thus, the second region LDD2 has a higher resistance than each of the first region LDD1 and third region LDD3. In this structure example, too, since the second region LDD2 is located between the first gate electrode GE1 and second gate electrode GE2, the resistance of the second region LDD2 can be increased without being affected by a mask misalignment in manufacture process, and the same advantageous effects as in the above-described structure example can be obtained.

In the meantime, the structure example shown in FIG. 8 can be combined with the above-described structure example shown in FIG. 3, etc. For example, in the thin-film transistor TR of the structure example shown in FIG. 8, the second region LDD2 may be formed to have a length L2 of 5 μm or more, which is greater than each of the length L1 of the first region LDD1 and the length L3 of the third region LDD3. In addition, in the thin-film transistor TR of the structure example shown in FIG. 8, each of the length L1 of the first region LDD1 and the length L3 of the third region LDD3 may be set at 3 μm or less.

As has been described above, according to the present embodiment, a display device, which can suppress degradation in display capability, can be provided.

Incidentally, in the above-described embodiment, the liquid crystal display device has been described as an example of the display device. However, the embodiment is applicable to other display devices, such as an organic electroluminescence display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   an insulative substrate;
   a semiconductor layer located above the insulative substrate and formed of polysilicon, the semiconductor layer including a first channel region, a second channel region, a source region, a drain region, a first region located between the source region and the first channel region and having an impurity concentration which is lower than an impurity concentration of the source region and is higher than an impurity concentration of the first channel region, a second region formed between the first channel region and the second channel region and having an impurity concentration which is equal to the impurity concentration of the first region, and a third region located between the drain region and the second channel region and having an impurity concentration which is lower than an impurity concentration of the drain region and is higher than an impurity concentration of the second channel region;
   an insulation film covering the semiconductor layer;
   a first gate electrode formed on the insulation film and located above the first channel region,
   a second gate electrode which is electrically connected to the first gate electrode, is formed on the insulation film, and is located above the second channel region;
   a source electrode put in contact with the source region;
   a drain electrode put in contact with the drain region;
   a source line electrically connected to the source electrode and supplied with a video signal; and
   a pixel electrode which is electrically connected to the drain electrode and in which a pixel potential corresponding to the video signal is written,
   wherein the impurity concentration of the third region is equal to the impurity concentration of the first region,
   a length of each of the first region and the third region is 3 μm or less, and
   the second region has a length of 5 μm or more, which is greater than the length of each of the first region and the third region.

2. The display device of claim 1, wherein
the first gate electrode and the second gate electrode are formed directly on the insulation film,
the first gate electrode and the second gate electrode are separate from each other at a position facing the semiconductor layer, and are connected to each other at a position not facing the semiconductor layer.

3. A display device comprising:
an insulative substrate;
a semiconductor layer located above the insulative substrate and formed of polysilicon, the semiconductor layer including a first channel region, a second channel region, a source region, a drain region, a first region located between the source region and the first channel region and having an impurity concentration which is lower than an impurity concentration of the source region and is higher than an impurity concentration of the first channel region, a second region formed between the first channel region and the second channel region and having an impurity concentration which is equal to the impurity concentration of the first region, and a third region located between the drain region and the second channel region and having an impurity concentration which is lower than an impurity concentration of the drain region and is higher than an impurity concentration of the second channel region;
an insulation film covering the semiconductor layer;
a first gate electrode formed on the insulation film and located above the first channel region,
a second gate electrode which is electrically connected to the first gate electrode, is formed on the insulation film, and is located above the second channel region;
a source electrode put in contact with the source region;
a drain electrode put in contact with the drain region;
a source line electrically connected to the source electrode and supplied with a video signal; and
a pixel electrode which is electrically connected to the drain electrode and in which a pixel potential corresponding to the video signal is written,
wherein the second region has a higher resistance than each of the first region and the third region,
the impurity concentration of the third region is equal to the impurity concentration of the first region,
the first channel region, the second region and the second channel region are arranged in a first direction,
the first channel region, the second region and the second channel region have a first width, a second width and a third width, respectively, in a second direction intersecting with the first direction, and
the second width is less than the first width and the third width.

4. The display device of claim 3, wherein a length of the second region is greater than a length of each of the first region and the third region.

5. The display device of claim 4, wherein the second region has a length of 5 µm or more.

6. The display device of claim 4, wherein the length of each of the first region and the third region is 3 µm or less.

7. The display device of claim 3, wherein
the first gate electrode and the second gate electrode are formed directly on the insulation film,
the first gate electrode and the second gate electrode are separate from each other at a position facing the semiconductor layer, and are connected to each other at a position not facing the semiconductor layer.

* * * * *